(12) United States Patent
Matsumoto et al.

(10) Patent No.: US 10,127,980 B2
(45) Date of Patent: Nov. 13, 2018

(54) INTEGRATED CIRCUIT INCLUDING MEMORY, AND WRITE METHOD

(71) Applicant: KABUSHIKI KAISHA TOSHIBA, Minato-ku (JP)

(72) Inventors: Mari Matsumoto, Kawasaki (JP); Shinichi Yasuda, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/703,476

(22) Filed: Sep. 13, 2017

(65) Prior Publication Data
US 2018/0261287 A1    Sep. 13, 2018

(30) Foreign Application Priority Data
Mar. 8, 2017    (JP) .................................. 2017-044132

(51) Int. Cl.
*G11C 13/00*    (2006.01)
*H01L 27/118*    (2006.01)

(52) U.S. Cl.
CPC .... *G11C 13/0069* (2013.01); *H01L 27/11807* (2013.01); *G11C 13/0021* (2013.01);
(Continued)

(58) Field of Classification Search
CPC ............ G11C 13/0069; G11C 13/0002; G11C 13/0021; G11C 13/0026; G11C 13/0028;
(Continued)

(56) References Cited

U.S. PATENT DOCUMENTS

| 5,537,056 A | 7/1996 | McCollum |
| 7,880,215 B2 | 2/2011 | Watanabe et al. |

(Continued)

FOREIGN PATENT DOCUMENTS

| JP | 11-176171 | 7/1999 |
| JP | 5045105 | 10/2012 |

(Continued)

OTHER PUBLICATIONS

Janakiraman Viraraghavan et al., "80Kb 10ns Read Cycle Logic Embedded High-K Charge Trap Multi-Time-Programmable Memory Scalable to 14nm FIN with no Added Process Complexity," 2016 Symposium on VLSI Circuits Digest of Technical Papers, IEEE, 2016. pp. 2.

*Primary Examiner* — Tan T. Nguyen
(74) *Attorney, Agent, or Firm* — Oblon, McClelland, Maier & Neustadt, L.L.P.

(57) ABSTRACT

An integrated circuit according to an embodiment includes: first and second wiring lines; a memory device including a first and second terminals connected to the first and second wiring line respectively; a first transistor including a high-k metal gate; a first circuit applying a first write voltage between the first and the second terminals, and switch the resistance of the memory device from a high-resistance state to a low-resistance state; a second circuit reading the resistance of the memory device, and comparing a read value of the resistance with a predetermined value; a third circuit lowering a threshold voltage of the first transistor when the read value of the resistance is greater than the predetermined value; a fourth circuit applying a second write voltage between the first and second terminals after the threshold voltage is lowered; and a fifth circuit raising the threshold voltage of the first transistor.

10 Claims, 11 Drawing Sheets

(52) U.S. Cl.
CPC . *G11C 13/0064* (2013.01); *H01L 2027/11838* (2013.01); *H01L 2027/11875* (2013.01)

(58) Field of Classification Search
CPC ............. G11C 13/004; G11C 13/0064; H01L 27/11807; H01L 2027/11875; H01L 2027/11838
USPC ........................................ 365/148, 158, 163
See application file for complete search history.

(56) References Cited

U.S. PATENT DOCUMENTS

| | | | |
|---|---|---|---|
| 9,355,740 B2 | 5/2016 | Zaitsu et al. | |
| 9,514,839 B2 | 12/2016 | Matsumoto et al. | |
| 9,842,648 B1 * | 12/2017 | Ahn ................... | G11C 13/004 |
| 2015/0380086 A1 * | 12/2015 | Park ................... | G11C 13/0069 365/148 |
| 2016/0148685 A1 * | 5/2016 | Roy ................... | G11C 13/0069 365/148 |

FOREIGN PATENT DOCUMENTS

| | | |
|---|---|---|
| JP | 2015-172989 | 10/2015 |
| JP | 2015-230919 | 12/2015 |

* cited by examiner

INTEGRATED CIRCUIT INCLUDING MEMORY, AND WRITE METHOD

CROSS REFERENCE TO RELATED APPLICATIONS

This application is based upon and claims the benefit of priority from the prior Japanese Patent Application No. 2017-044132, filed on Mar. 8, 2017, the entire contents of which are incorporated herein by reference.

FIELD

Embodiments described herein relate generally to integrated circuits including memories, and memory write methods.

BACKGROUND

A programmable logic switch is a device that is used in field programmable gate arrays (FPGAs) and the like that need to reconfigure arithmetic processing circuits and wiring circuits, and can switch on and off the logic switch in accordance with data stored in a memory. The memory is a volatile memory, such as a static random-access memory (SRAM). The data in such a volatile memory disappears when the power is turned off. Therefore, when power is supplied, data needs to be written again into the memory.

A known memory for programmable logic switches is a nonvolatile memory including nonvolatile memory devices as the memory elements. The nonvolatile memory devices may be flash-memory devices, one-time programmable (OTP) memory devices, or the like. In any of the nonvolatile memories, however, a certain degree of variation appears in the results of writing, though the writing is performed under the same conditions. To prevent or reduce the variation, a flash-memory device performs additional writing. There are several known methods for performing such additional writing. However, an additional circuit is required to implement any of these methods, resulting in a complicated memory peripheral circuit configuration.

DETAILED DESCRIPTION

An integrated circuit according to an embodiment includes: first and second wiring lines; a memory device including a first terminal connected to the first wiring line and a second terminal connected to the second wiring line, a resistance of the memory device being switchable between a high-resistance state and a low-resistance state; a first transistor including a high-k metal gate, one of a source and a drain of the first transistor being connected to the first wiring line; a first circuit configured to apply a first write voltage between the first terminal and the second terminal, and switch the resistance of the memory device from a high-resistance state to a low-resistance state; a second circuit configured to read the resistance of the memory device, and compare a read value of the resistance with a predetermined value; a third circuit configured to lower a threshold voltage of the first transistor when the read value of the resistance is greater than the predetermined value; a fourth circuit configured to apply a second write voltage between the first terminal and the second terminal after the threshold voltage is lowered, the second write voltage being not lower than the first write voltage; and a fifth circuit configured to raise the threshold voltage of the first transistor.

Before embodiments of the present invention are described, the course events before the present inventors achieved the present invention will be described below.

Figure 1:
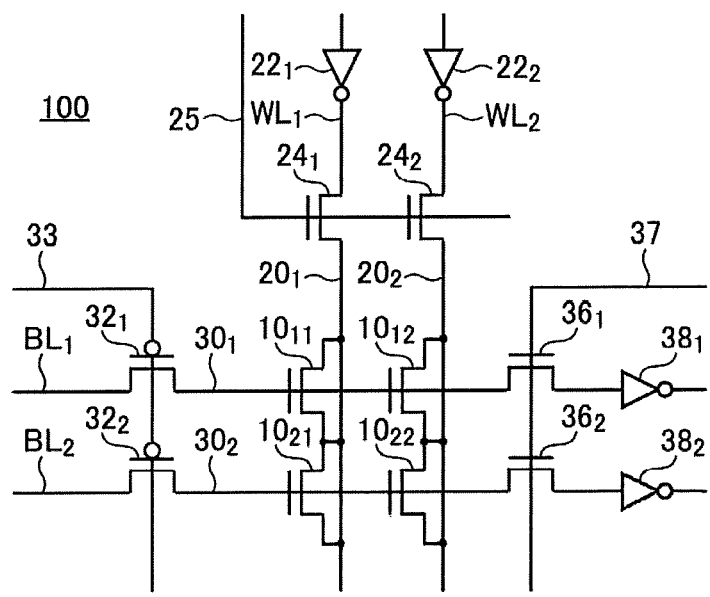
FIG. 1 is a circuit diagram showing an example of an integrated circuit including an OTP memory device array.

FIG. 1 shows an integrated circuit including a memory that uses one-time programmable (OTP) memory devices as the memory devices. This memory includes memory devices $10_{11}$ through $10_{22}$ arranged in a (2×2) array. The source and the drain of each memory device $10_{ij}$ (i, j=1, 2) are connected to a wiring line $20_i$ extending in the column direction, and the gate of each memory device $10_{ij}$ is connected to a wiring line $30_j$ extending in the row direction. That is, this OTP device has two terminals, one of the terminals being the gate, the other one of the terminals being the source and the drain.

Each wiring line $20_j$ (j=1, 2) is connected to the output terminal of an inverter $22_j$ via a transistor $24_j$, and the input terminal of the inverter $22_j$ is connected a word line $WL_j$. The gate of each transistor $24_j$ (j=1, 2) is connected to a control wiring line 25.

One end of each wiring line $30_i$ (i=1, 2) is connected to the drain of a p-channel MOS transistor $32_i$ with a high withstand voltage, and the other end is connected to the input terminal of an inverter $38_i$ via a transistor $36_i$. The source of each transistor $32_i$ (i=1, 2) is connected to a bit line $BL_i$, and the gate of each transistor $32_i$ is connected to a control wiring line 33. The gate of each transistor $36_i$ (i=1, 2) is connected to a control wiring line 37.

Writing to be performed on the memory device $10_{11}$ will be described below as an example of a write method implemented for this memory.

First, a voltage is applied to the control wiring line 25 so that the transistors $24_1$ and $24_2$ are put into an on-state, and a potential is applied to the word lines $WL_1$, and $WL_2$ so that the potential of the wiring lines $20_1$ and $20_2$ becomes 0 V. Meanwhile, a voltage is applied to the control wiring line 33 so that the transistors $32_1$ and $32_2$ are put into an on-state, and a write voltage Vprg is applied to the bit line $BL_1$ so that a write inhibition voltage Vinh, which is half the write voltage Vprg, for example, is applied to the bit line $BL_2$. As a result, in the memory device $10_{11}$, the write voltage Vprg is applied between the gate and the source/drain, and thus, writing is performed. In the other memory devices $10_{12}$, $10_{21}$, and $10_{22}$, however, a lower voltage than the write voltage Vprg is applied between the gate and the source/drain, and writing is not performed.

The resistance of an OTP memory device after writing depends on the write voltage and the amount of the current flowing between the gate and the source or between the gate and the drain. If the oxide film destruction in an OTP memory device after a write operation is insufficient, the resistance of the OTP memory device becomes higher than expected.

In a case where high-resistance writing is performed on an OTP memory device as above, the voltage to be applied to the oxide film is lower than that in the initial state even if writing is repeatedly performed thereafter under the same write conditions. Therefore, to perform additional writing, it is necessary to increase the voltage or the amount of current to that under the initial write conditions.

If the voltage is increased in the case where writing is performed on the memory device $10_{11}$, for example, the value (level) of the pulse of the write gate voltage to be applied to the memory device $10_{11}$ is increased, and the pulse time is also adjusted as necessary. If the amount of current is increased, the gate voltage of the transistor $32_1$ is lowered, or the gate voltage of the transistor $24_1$ is raised. Normally, the transistors $32_1$ and $32_2$, and the transistors $24_1$ and $24_2$ are designed to have such device sizes that a voltage and a current sufficient for writing can be applied, with additional writing being taken into account. In a large-sized memory array, however, the sizes of the transistors $24_1$, $24_2$, $32_1$, and $32_2$ of the above two types that increase in number with array size should be made as small as possible.

In view of the above, the inventors have made intensive studies, and managed to solve the above problem through the concepts described below.

Figure 2A:
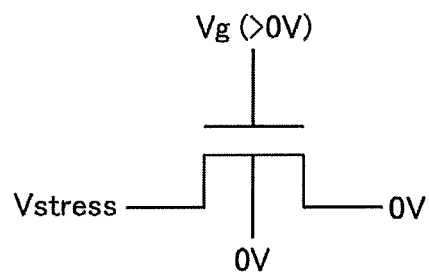
FIG. 2A is a diagram showing the applied voltages in a case where writing is performed on a transistor having a high-k metal gate.
Figure 2B:
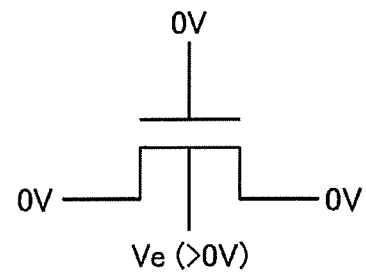
FIG. 2B is a diagram showing the applied voltages in a case where erasing is performed.

In the above described memory array, each transistor is formed with a general-purpose CMOS, and, depending on the process technology, a high-k metal gate is used as a general-purpose CMOS. Therefore, each transistor is a transistor having a high-k metal gate. A transistor having a high-k metal gate includes a source and a drain, a gate formed with a metal, and a gate insulating film formed with a high-k material (this film is also called a high-k insulating film). A high-k material is a material with a higher relative dielectric constant than that of a silicon oxide. In a transistor having a high-k metal gate, electric charge is trapped in the high-k insulating film. Therefore, a report says that such a transistor functions as a memory device on which writing and erasing can be repeatedly performed. An example of the applied voltages in a case where writing is performed on a memory device having a high-k metal gate is shown in FIG. 2A, and an example of the applied voltages in a case where erasing is performed is shown in FIG. 2B. At the time of writing, a gate voltage Vg is applied to the gate, a stress voltage Vstress is applied to the drain, 0 V is applied to the source, and 0 V is applied to the substrate. At the time of erasing, 0 V is applied to the gate, the source, and the drain, and an erase voltage Ve (>0 V) is applied to the substrate.

Figure 2C:
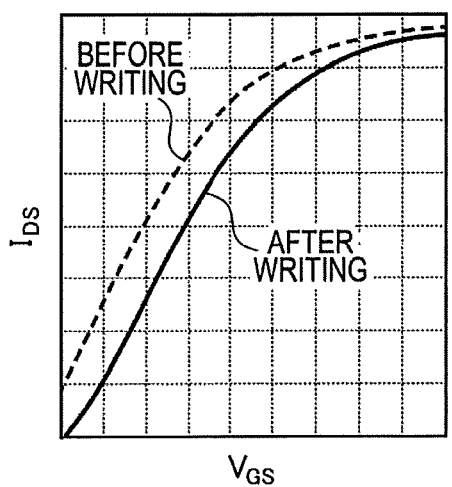
FIG. 2C is a graph showing I-V characteristics before and after writing.

As writing and erasing operations are performed on a memory device having a high-k metal gate in the above manner, the threshold voltage of this memory device increases and decreases, as can be seen from FIG. 2C. In FIG. 2C, the abscissa axis indicates the voltage $V_{GS}$ between the gate and the source, and the ordinate axis indicates the current $I_{DS}$ between the drain and the source. A change in the threshold voltage leads to an increase or decrease in the amount of current under the same I-V operating conditions. In view of this, the inventors presumed that the above problem could be solved if transistors each having a high-k metal gate were used as the transistors $24_1$ and $24_2$. Such configurations will be described below as embodiments.

The following is a description of embodiments of the present invention, with reference to the accompanying drawings.

First Embodiment

Figure 3:
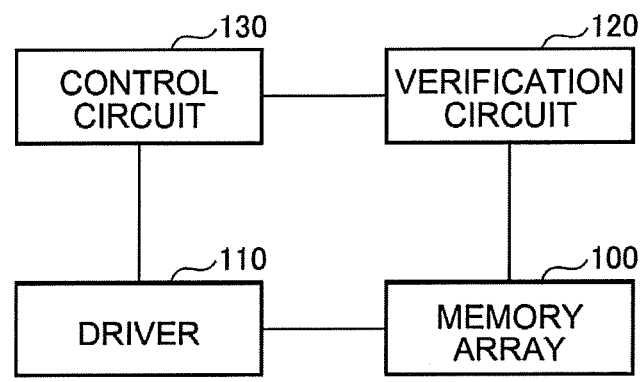
FIG. 3 is a block diagram showing an integrated circuit according to a first embodiment.

FIG. 3 shows an integrated circuit according to a first embodiment. The integrated circuit of the first embodiment includes a memory array 100, a driver 110, a verification circuit 120, and a control circuit 130. The memory array 100 includes memory devices arranged in an array, and is connected to the driver 110. The control circuit 130 supplies the driver 110 with a control signal such as a program instruction signal or a memory device address signal. In accordance with the control signal, the driver 110 applies a program voltage to the selected memory device. Also, in accordance with the control signal, the driver 110 may apply a predetermined voltage to the unselected memory devices, or put the potential of an electrode of a certain memory device into a floating state. The verification circuit 120 determines whether the resistance value of the memory device is a desired value (whether the programming has been completed), and supplies the control circuit 130 with information indicating the result of the determination. In accordance with the information from the verification circuit 120, the control circuit 130 transmits a control signal to the driver 110 if necessary.

Figure 4:
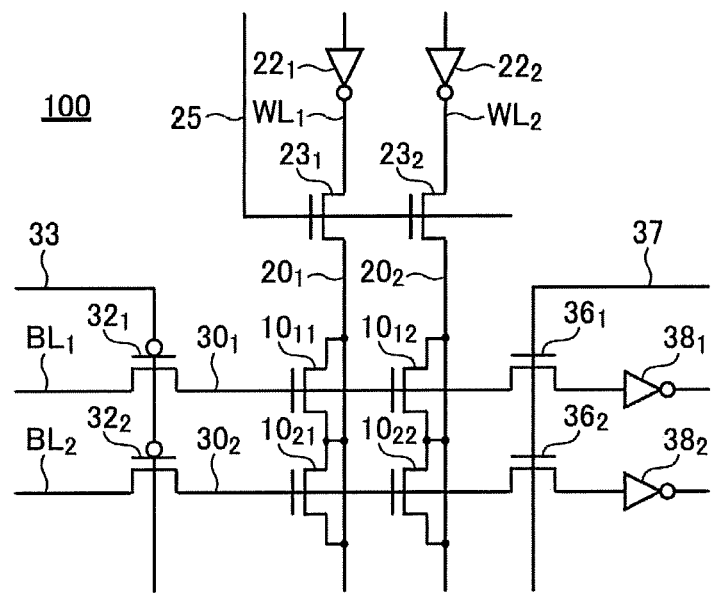
FIG. 4 is a circuit diagram showing a memory array according to the first embodiment.

FIG. 4 shows an example of the memory array 100 of the first embodiment. This memory array 100 is used for a logic switch of a field programmable gate array (FPGA), for example. In the memory array 100, OTP memory devices as the memory devices are arranged in a (2×2) array. This memory array 100 is not necessarily an array in which memory devices are arranged in a (2×2) array, but may be an array in which memory devices are arranged in a (m×n) array, where m and n are integers. This memory array 100 includes OTP memory devices $10_{11}$ through $10_{22}$. The source and the drain of each memory device $10_{ij}$ (i, j=1, 2) are connected to a wiring line $20_i$ extending in the column direction, and the gate of each memory device $10_{ij}$ is connected to a wiring line $30_j$ extending in the row direction.

Each wiring line $20_j$ (j=1, 2) is connected to the output terminal of an inverter $22_j$ via a cutoff transistor $23_j$, and the input terminal of the inverter $22_j$ is connected a word line $WL_j$.

Each cutoff transistor $23_j$ (j=1, 2) is a transistor having a high-k metal gate, and the gate of each cutoff transistor $23_j$ is connected to a control wiring line 25.

One end of each wiring line $30_i$ (i=1, 2) is connected to the drain of a p-channel MOS transistor $32_i$ with a high withstand voltage, and the other end is connected to the input terminal of an inverter $38_i$ via a transistor $36_i$. The source of each transistor $32_i$ (i=1, 2) is connected to a bit line $BL_i$, and the gate of each transistor $32_i$ is connected to a wiring line 33. The gate of each transistor $36_i$ (i=1, 2) is connected to a wiring line 37. That is, the memory array 100 of the first embodiment is the same as the memory array shown in FIG. 1, except that the transistors $24_1$ and $24_2$ are replaced with the transistors $23_1$ and $23_2$ each having a high-k metal gate. Normal writing in the memory array 100 of the first embodiment is performed in the same manner as in the memory array shown in FIG. 1.

This normal writing is performed by the control circuit 130 (the first circuit) via the driver 110.

Reading is performed by the control circuit 130. After writing is performed on the memory array 100, input signals $In_1$ and $In_2$ (not shown) are applied to the word lines $WL_1$ and $WL_2$, respectively, and output signals are output from the output terminals of the inverters $38_1$ and $38_2$. As is apparent from this read method, in the memory array 100 of the first embodiment, writing is performed on at most one memory device among the memory devices arranged in the same row.

In this memory array, if writing on a memory device is not sufficient, additional writing is performed. It is the verification circuit 120 (the second circuit) that determines whether writing on a memory device is sufficient. Specifically, after writing is performed on the memory device to be subjected to writing, which is the memory device $10_{11}$, for example, the control circuit 130 applies a read current to the corresponding word lines $WL_1$ from the driver 110, and the verification circuit 120 detects the read current output from the corresponding bit line $BL_1$. The verification circuit 120 then determines whether the writing on the memory device $10_{11}$ is sufficient.

(Write Method)

In a case where writing is determined to be insufficient by the verification circuit 120, additional writing is performed. Referring now to FIGS. 5 through 8, writing to be performed on the memory device $10_{11}$ will be described below as an example of a write method involving the additional writing. In FIGS. 5 through 8 for explaining the write method, the inverters $22_1$, $22_2$, $38_1$, and $38_2$ are omitted from the memory array 100 shown in FIG. 4, for ease of explanation.

In the first embodiment, after normal writing is performed on a memory device, reading is performed. If the resistance value of the memory device becomes equal to or greater than a predetermined resistance value, additional writing is performed on the memory device. For example, in a case where writing on the memory device $10_{11}$ is insufficient, an erasing operation is performed on the transistor $23_1$, so as to apply the same gate current as that for the writing to the transistor $23_1$ connected to the path on which the additional writing is to be performed. Here, the path is formed with the word line $WL_1$ and the wiring line $20_1$. After that, writing is again performed on the memory device $10_{11}$ of the memory array 100, and writing is performed on the transistor $23_1$, to return the transistor $23_1$ to the initial state.

Figure 5:
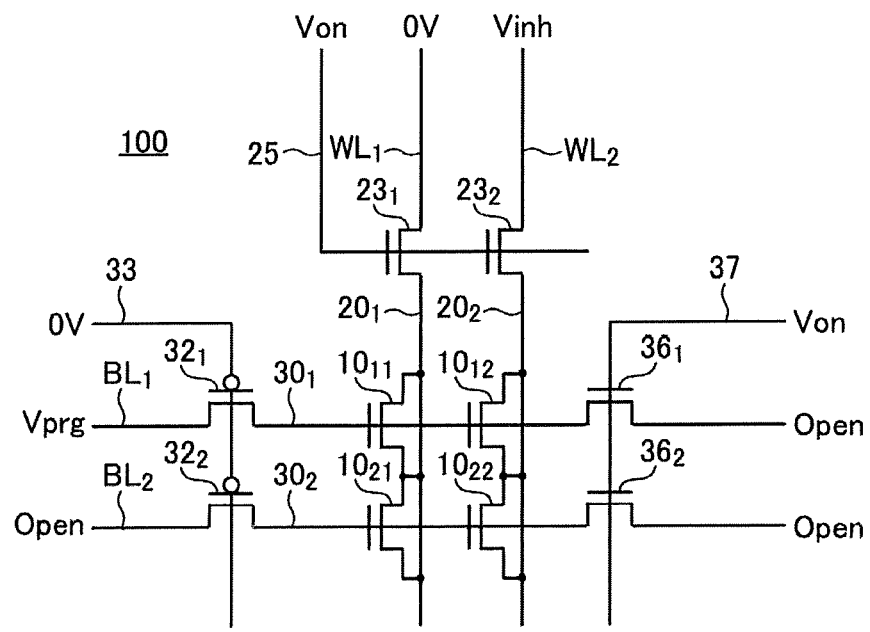
FIG. 5 is a diagram showing the applied voltages in a case where writing is performed on a memory device in the initial state in the first embodiment.

FIG. 5 is a diagram showing the applied voltages in a case where writing is performed on the memory device $10_{11}$ in the initial state.

As a write voltage Vprg is applied to the gate of the memory device $10_{11}$ to be subjected to writing, the gate voltage of the transistor $32_1$ is set at 0V, for example, via the wiring line 33, and the write voltage Vprg is applied to the bit line $BL_1$ connected to the source end of the transistor $32_1$, so that the transistor $32_1$ is put into an on-state. At this point, the transistor $32_2$ is also put into an on-state, and therefore, the bit line $BL_2$ is put into an open state, or a write inhibition voltage Vinh is applied to the bit line $BL_2$, so that any voltage equal to or higher than the write voltage Vprg is not applied to the wiring line $30_2$. A voltage Von is then applied to the gate of the transistor $23_1$ via the wiring line 25 to put the transistor $23_1$ into an on-state, and 0 V is applied to the word line $WL_1$, so that the source and the drain of the memory device $10_{11}$ are set at 0 V, or the potential of the wiring line $20_1$ becomes 0 V.

Meanwhile, the write inhibition voltage Vinh is applied via the transistor $23_2$ so that no writing is performed on the memory device $10_{12}$. As a result of this, the write voltage Vprg is also applied to the gate of the memory device $10_{12}$, but the source and the drain are raised to the write inhibition voltage Vinh via the wiring line $20_2$. Thus, writing on the memory device $10_{12}$ can be prevented. In this writing, the voltage Von is applied to the wiring line 37, so that the transistors $36_1$ and $36_2$ are put into an on-state, and the sources of the transistors $36_1$ and $36_2$ are put into an open state. The bit line $BL_2$ is also put into an open state.

Figure 6:
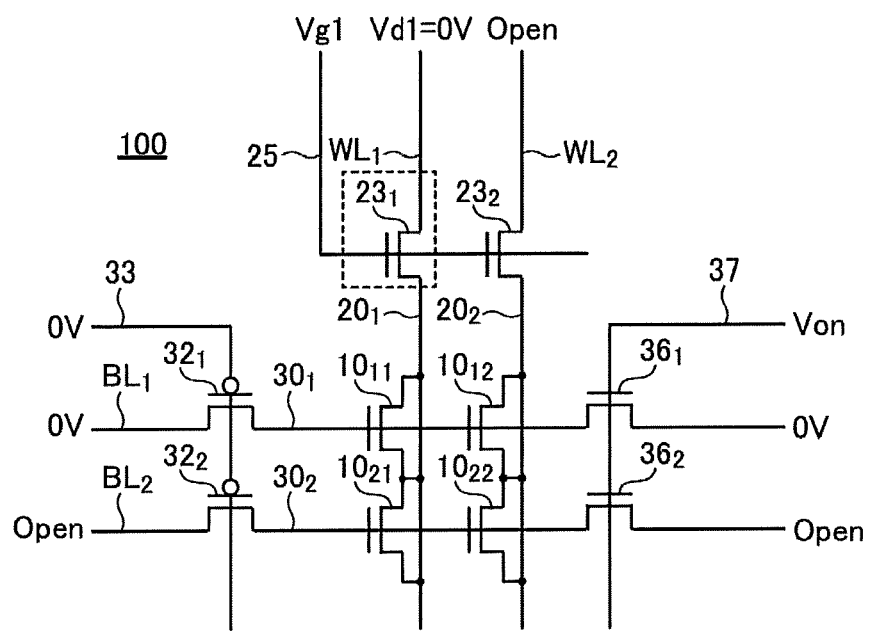
FIG. 6 is a circuit diagram showing the applied voltages in a case where an erasing operation is performed on a transistor in the first embodiment.

In a case where the memory device $10_{11}$ on which writing has been performed has a higher resistance than a predetermined resistance though the writing has been performed in the above described manner, additional writing is performed. This additional writing is performed by the control circuit 130 (the third circuit and fourth circuit) via the driver 110. When the additional writing is performed, not only the write voltage is adjusted, but also an erasing operation is performed on the transistor $23_1$ having a high-k oxide film as the gate insulating film, so that the amount of the current between the gate and the source or between the gate and the drain of the memory device $10_{11}$ is increased. As a result of this, the threshold voltage of the transistor $23_1$ is changed toward the negative direction, or the threshold voltage is lowered, and the amount of the current in the wiring line $20_1$ is made larger than that prior to the erasing operation. Referring now to FIG. 6, a method of performing an erasing operation on the transistor $23_1$ is described. To perform an erasing operation on the transistor $23_1$, 0 V is applied to the source and the drain of the transistor $23_1$. When the voltage is applied to the drain of the transistor $23_1$, 0 V is applied to the source of the transistor $32_1$, so that 0 V is applied to the drain of the transistor $23_1$ via the path between the gate and the source or between the gate and drain of the memory device $10_{11}$. Further, a voltage Vg1 (<0 V) is applied to the gate of the transistor $23_1$ via the wiring line 25. Alternatively, the transistor $23_1$ may be formed in a different well from that for the memory devices $10_{11}$ through $10_{22}$ and the transistors $36_1$ and $36_2$, the gate voltage of the transistor $23_1$ may be set at 0 V, and a negative voltage −Vg1 may be applied to the substrate. In this manner, an erasing operation can be performed on the transistor $23_1$.

During the erasing operation on the transistor $23_1$, the word line $WL_2$, the bit line $BL_2$, and the source of the transistor $36_2$ are in an open state, as shown in FIG. 6.

Figure 7:
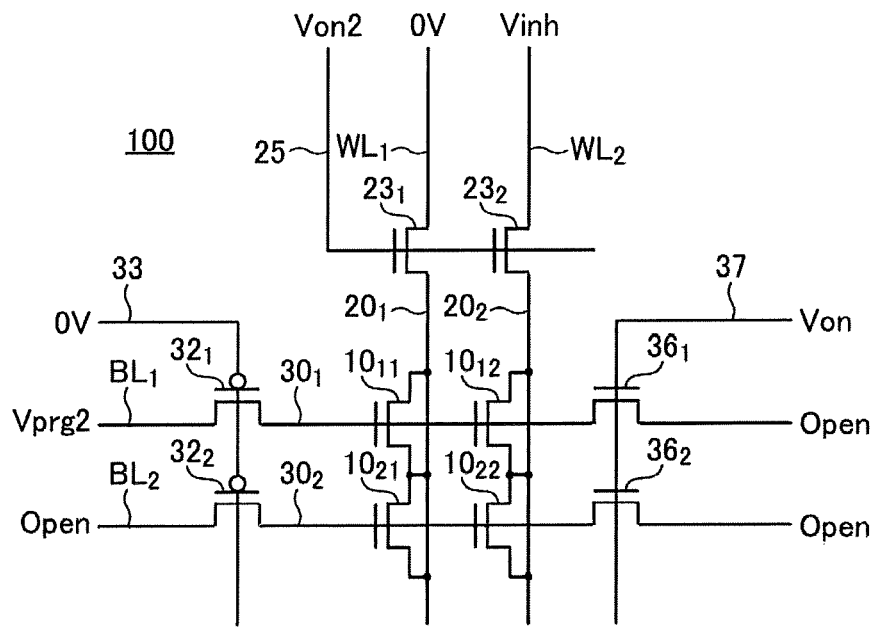
FIG. 7 is a circuit diagram showing the applied voltages in a case where additional writing is performed on a memory device in the first embodiment.

Referring now to FIG. 7, a method of performing additional writing on the memory device $10_{11}$ is described.

The additional writing is performed in the same manner as the writing in the initial state, except for a write voltage Vprg2 to be applied to the bit line $BL_1$ and a voltage Von2 to be applied to the wiring line 25. The write voltage Vprg2 (≥Vprg) that is used in this additional writing and is applied to the bit line $BL_1$, and the voltage Von2 (≥Von) that is used in this additional writing and is applied to the gate of the transistor $23_1$ via the wiring line 25 may be changed depending on the resistance of the memory device $10_{11}$ on which the additional writing is to be performed.

At the time of this additional writing, the bit line $BL_2$ and the sources of the transistor $36_1$ and $36_2$ are in an open state, as shown in FIG. 7.

Figure 8:
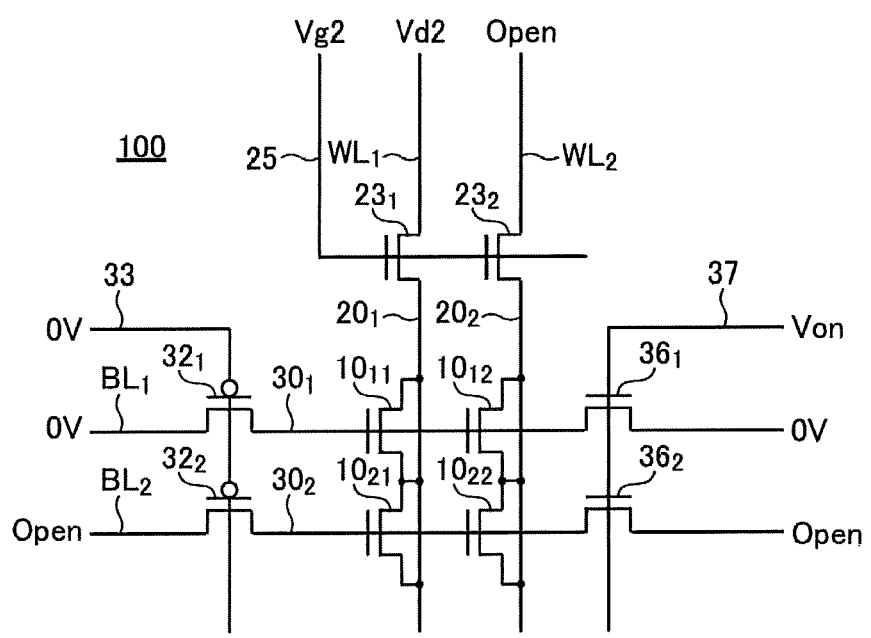
FIG. 8 is a circuit diagram showing the applied voltages in a case where a transistor is initialized in the first embodiment.

Lastly, the transistor $23_1$ is initialized. This initializing operation is performed by the control circuit 130 (the fifth circuit) via the driver 110. Referring now to FIG. 8, a method of applying the voltage for this initialization is described. The reason that the initialization is performed at this stage is to prevent a difference in the threshold voltages of the transistors $23_1$ and $23_2$ between the column to which the memory device subjected to the additional writing is connected and the column to which the memory device subjected to the additional writing is not connected, and thus, prevent wrong reading of read data. To initialize the transistor $23_1$, writing should be performed on the transistor $23_1$ on which an erasing operation has been performed. To perform writing on the transistor $23_1$, a voltage Vd2 is applied to the word line $WL_1$ connected to the source of the transistor $23_1$, and a voltage Vg2 is applied to the gate. Also, 0 V is applied to the bit line $BL_1$ connected to the source of the transistor $32_1$, so that 0 V is applied to the drain of the transistor $23_1$ via the path between the gate and the source or between the gate and the drain of the memory device $10_{11}$. Here, the voltage Vd2 is a positive voltage that is lower than the write voltage Vprg, or Vd2<Vprg. This voltage Vd2 does not cause writing on the memory device $10_{11}$. With this, the threshold voltage of the transistor $23_1$ is changed toward the positive direction, or the threshold voltage is increased, so that the threshold voltages of the transistors $23_1$ and $23_2$ are prevented from varying. During the initialization of the transistor $23_1$, the word line $WL_2$, the bit line $BL_2$, and the source of the transistor $36_2$ are in an open state, as shown in FIG. 8.

As described above, according to the first embodiment, transistors each having a high-k metal gate are used as the transistors $23_1$ and $23_2$. Thus, it is possible to provide an integrated circuit including a memory that can avoid having a complicated circuit configuration even if additional writing is to be performed. It is also possible to provide a write method.

Second Embodiment

Referring now to FIGS. 9 through 13, an integrated circuit according to a second embodiment is described. The integrated circuit of the second embodiment has the same configuration as the integrated circuit of the first embodiment shown in FIG. 3. That is, the integrated circuit of the second embodiment includes a memory array 100, a driver 110, a verification circuit 120, and a control circuit 130. The memory array 100 includes memory devices arranged in an array, and is connected to the driver 110. The control circuit 130 supplies the driver 110 with a control signal such as a program instruction signal or a memory device address signal. In accordance with the control signal, the driver 110 applies a program voltage to the selected memory device. Also, in accordance with the control signal, the driver 110 may apply a predetermined voltage to the unselected memory devices, or put the potential of an electrode of a certain memory device into a floating state. The verification circuit 120 determines whether the resistance value of the memory device is a desired value (whether the programming has been completed), and supplies the control circuit 130 with information indicating the result of the determination. In accordance with the information from the verification circuit 120, the control circuit 130 transmits a control signal to the driver 110 if necessary.

Figure 9:
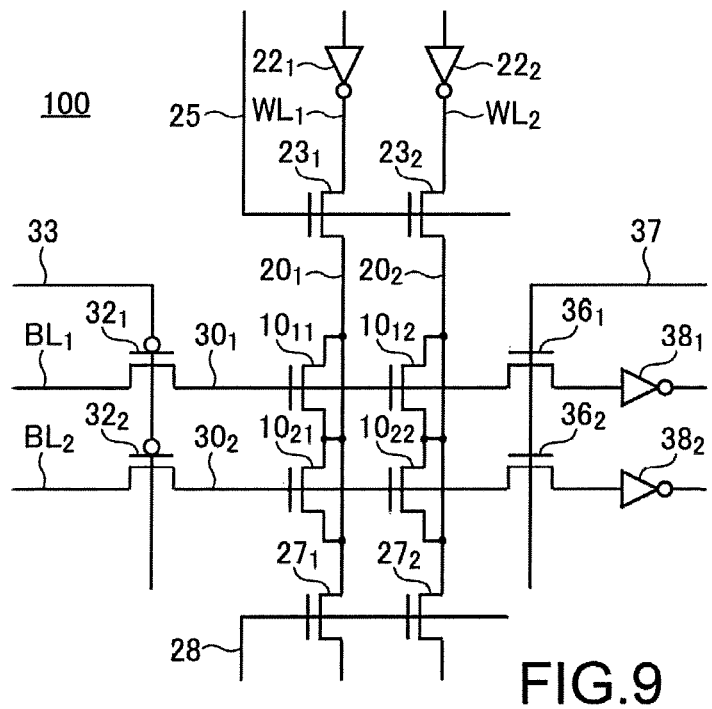
FIG. 9 is a circuit diagram showing a memory array according to a second embodiment.

FIG. 9 shows the memory array 100 of the second embodiment. The memory array 100 of the second embodiment has the same configuration as the memory array 100 of the first embodiment shown in FIG. 4, except that transistors $27_1$ and $27_2$ are newly added. The source or the drain of each transistor $27_j$ (j=1, 2) is connected to a wiring line $20_j$, and the gate of each transistor $27_j$ is connected to a wiring line 28.

The transistors $27_1$ and $27_2$ play an auxiliary role in increasing the amount of current at a time of writing.

In the second embodiment, before normal memory writing and reading are performed, writing is performed on the transistor $23_1$ connected to the source and the drain of the memory device $10_{11}$, which is the memory device on which writing is to be performed.

(Write Method)

Referring now to FIGS. 10 through 13, an example case where writing is performed on the memory device $10_{11}$ is described. In FIGS. 10 through 13 for explaining the write method, the inverters $22_1$, $22_2$, $38_1$, and $38_2$ are omitted from the memory array 100 shown in FIG. 9, for ease of explanation.

Figure 10:
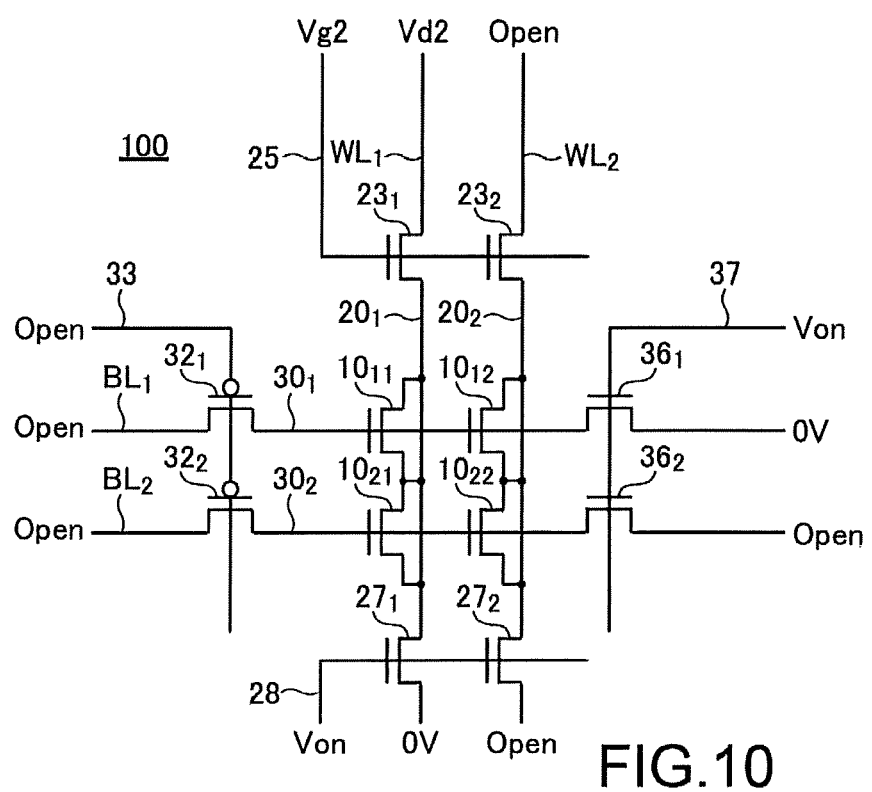
FIG. 10 shows the applied voltages in a case where writing is performed on a transistor in the second embodiment.

First, FIG. 10 shows the applied voltages in a case where writing is performed on the transistor $23_1$. To perform writing on the transistor $23_1$, a voltage Vd2 is applied to the word line $WL_1$ connected to the source of the transistor $23_1$, and a voltage Vg2 is applied to the wiring line 25 connected to the gate of the transistor $23_1$. Also, 0 V is applied to the source of the transistor $27_1$, and a voltage Von to switch on the transistor $27_1$ is applied to the gate of the transistor $27_1$ via the wiring line 28, so that 0 V is applied to the drain of the transistor $23_1$ via the transistor $27_1$. As a result of this, writing is performed on the transistor $23_1$, and the threshold voltage changes toward the positive direction. Accordingly, as the amount of current flowing via the transistor $23_1$ is restricted in advance, the amount of current can be increased through initialization if the value of the resistance of the memory device $10_{11}$ after writing is greater than a predetermined value. At the time of this initialization, the voltage Von is applied to a wiring line 37, to switch on the transistors $36_1$ and $36_2$. Meanwhile, the bit lines $BL_1$ and $BL_2$, a wiring line 33, the drain of the transistor $27_2$, and the drain of the transistor $36_2$ are put into an open state, and 0 V is applied to the drain of the transistor $36_1$.

Figure 11:
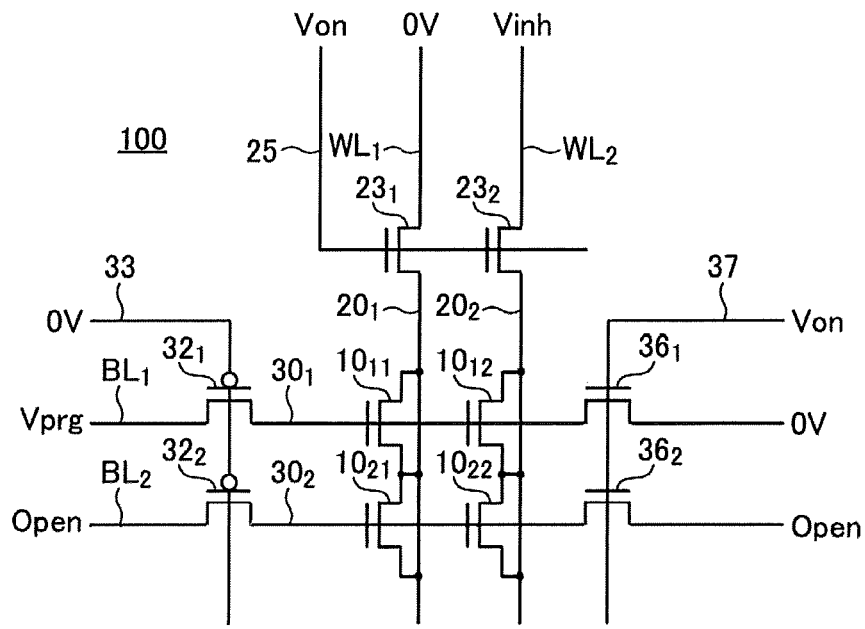
FIG. 11 is a diagram showing the applied voltages in a case where writing is performed on a memory device in the initial state in the second embodiment.

Next, writing is performed on the memory device. FIG. 11 shows the applied voltages in a case where writing is performed on the memory device in the initial state. The transistors $27_1$ and $27_2$ are not used in the write method described below with reference to FIGS. 11 through 13, and therefore, the transistors $27_1$ and $27_2$ are not shown in FIGS. 11 through 13.

As a write voltage Vprg is applied to the gate of the memory device $10_{11}$ to be subjected to writing, a voltage of 0 V is applied to the wiring line 33 connected to the gate of the transistor $32_1$, for example, so that the transistor $32_1$ is put into an on-state, and the write voltage Vprg is applied to the bit line $BL_1$ connected to the source of the transistor $32_1$. Meanwhile, the voltage Von to switch on the transistor $23_1$ is applied to the wiring line 25 connected to the gate of the transistor $23_1$, and a voltage of 0 V is further applied to the word line $WL_1$ connected to the source of the transistor $23_1$, so that the potential of the wiring line $20_1$ to which the source and the drain of the memory device $10_{11}$ are connected becomes 0 V.

Meanwhile, a write inhibition voltage Vinh is applied to the word line $WL_2$ via the transistor $23_2$ so that no writing is performed on the memory device $10_{12}$. As a result of this, the potentials of the source and the drain of the memory device $10_{12}$ are raised. Thus, writing on the memory device $10_{12}$ can be prevented even if the write voltage is also applied to the gate of the memory device $10_{12}$. In a case where writing is performed on the memory device $10_{11}$, Von is applied to the wiring line 37 to switch on the transistors $36_1$ and $36_2$, and 0 V is applied to the source of the transistor $36_1$. Meanwhile, the bit line $BL_2$ and the source of the transistor $36_2$ are put into an open state.

Figure 12:
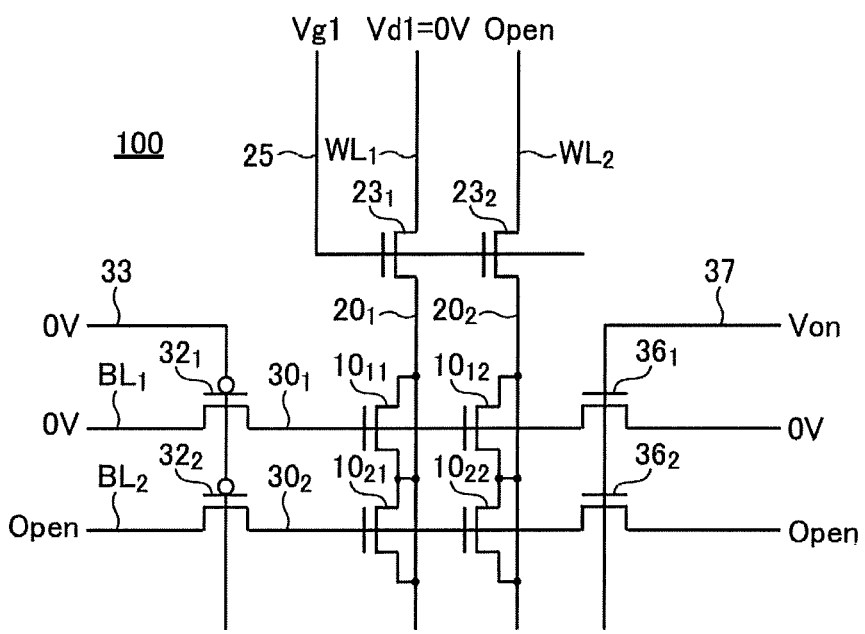
FIG. 12 is a circuit diagram showing the applied voltages in a case where an erasing operation is performed on a transistor in the second embodiment.

In a case where the memory device $10_{11}$ on which writing has been performed has a higher resistance than a predetermined resistance though the writing has been performed in the above described manner, additional writing is performed. At the time of additional writing, not only the write voltage is adjusted, but also the amount of the current between the gate and source or between the gate and the drain of the memory device $10_{11}$, which is the memory device to be subjected to writing, is increased. Therefore, initialization is performed on the transistor $23_1$ on which writing has been performed, so that the threshold voltage is changed toward the negative direction, and the value of the current in the wiring line $20_1$ is made greater than that prior to the initialization. Referring now to FIG. 12, a method of performing erasing on the transistor $23_1$ is described. FIG. 12 is a diagram showing the applied voltages in a case where erasing is performed on the transistor $23_1$.

To perform erasing on the transistor $23_1$, 0 V is applied to the source and the drain of the transistor $23_1$. Here, 0 V is applied to the bit line $BL_1$ connected to the source of the transistor $32_1$, so that 0 V is applied to the drain of the transistor $23_1$ via the path between the gate and the source or between the gate and the drain of the memory device $10_{11}$. Further, a voltage Vg1 (<0 V) is applied to the wiring line 25 connected to the gate of the transistor $23_1$, as shown in FIG. 12. Alternatively, the transistors $23_1$ and $23_2$ may be formed in a different well from that for the memory devices $10_{11}$ through $10_{22}$ and the transistors $36_1$ and $36_2$, the gate voltage of the transistor $23_1$ may be set at 0 V, and a negative voltage −Vg1 may be applied to the substrate. In this manner, erasing (initialization) can be performed on the transistor $23_1$. In the erasing operation illustrated in FIG. 12, 0 V is applied to the wiring line 33, so that the transistors $32_1$ and $32_2$ are switched on. Further, the voltage Von is applied to the wiring line 37, so that the transistors $36_1$ and $36_2$ are switched on. The voltage of 0V is applied to the bit line $BL_1$ and the drain of the transistor $36_1$, and the bit line $BL_2$ and the drain of the transistor $36_2$ are in an open state.

Figure 13:
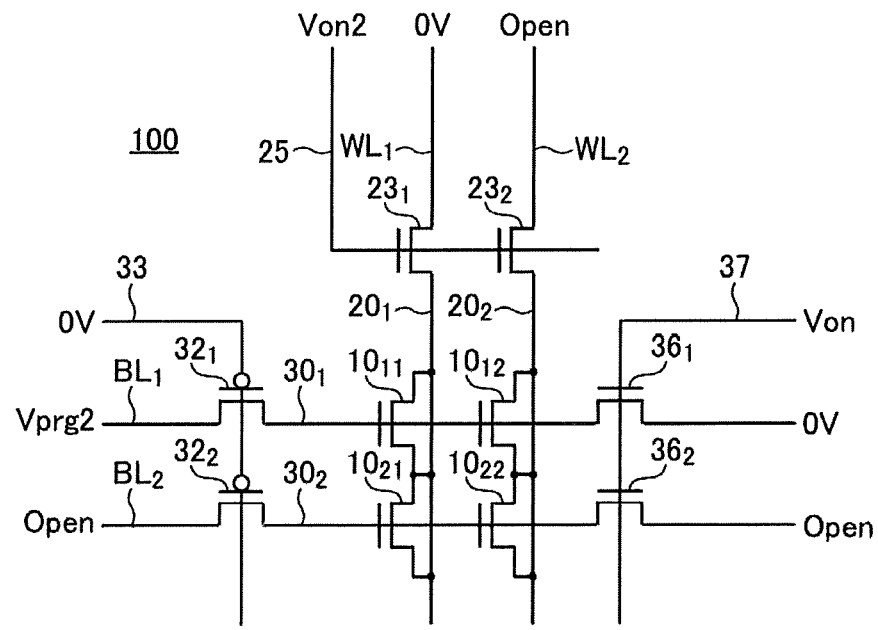
FIG. 13 is a circuit diagram showing the applied voltages in a case where additional writing is performed on a memory device in the second embodiment.

Lastly, additional writing is performed on the memory device $10_{11}$. Referring now to FIG. 13, a method of performing the additional writing is described. FIG. 13 is a diagram showing the applied voltages in a case where additional writing is performed on the memory device $10_{11}$. The additional writing is performed in the same manner as the writing in the initial state, except for a write voltage Vprg2 to be applied to the bit line $BL_1$ and a voltage Von2 to be applied to the wiring line 25. The write voltage Vprg2 (≥Vprg) that is used in this additional writing and is applied to the bit line $BL_1$, and the voltage Von2 (≥Von) that is used in this additional writing and is applied to the wiring line 25 connected to the gate of the transistor $23_1$ may be changed depending on the resistance of the memory device $10_{11}$ on which the additional writing is to be performed.

At the time of this additional writing, the bit line $BL_2$ and the sources of the transistor $36_1$ and $36_2$ are in an open state, as shown in FIG. 13.

In a case where the decrease in the resistance of the memory device on the memory device $10_{11}$, which is the memory device on which writing has been performed, is insufficient though the additional writing has been performed, the erasing operation of the first embodiment shown in FIG. 6 may be additionally performed to further increase the amount of current.

As described above, according to the second embodiment, transistors each having a high-k metal gate are used as the transistors $23_1$ and $23_2$. Thus, it is possible to provide an integrated circuit including a memory that can avoid having a complicated circuit configuration even if additional writing is to be performed. It is also possible to provide a write method.

Third Embodiment

In both the first embodiment and the second embodiment, the memory devices are OTP memory devices as described above. However, the same effects as above can be achieved even if the memory devices are replaced with resistive change memory devices.

Such a configuration is described below as a third embodiment.

Referring now to FIGS. 14 through 19, an integrated circuit according to a third embodiment is described. The integrated circuit of the third embodiment has the same configuration as the integrated circuit of the second embodiment, except that the memory devices constituting a memory array are resistive change memory devices.

Figure 14:
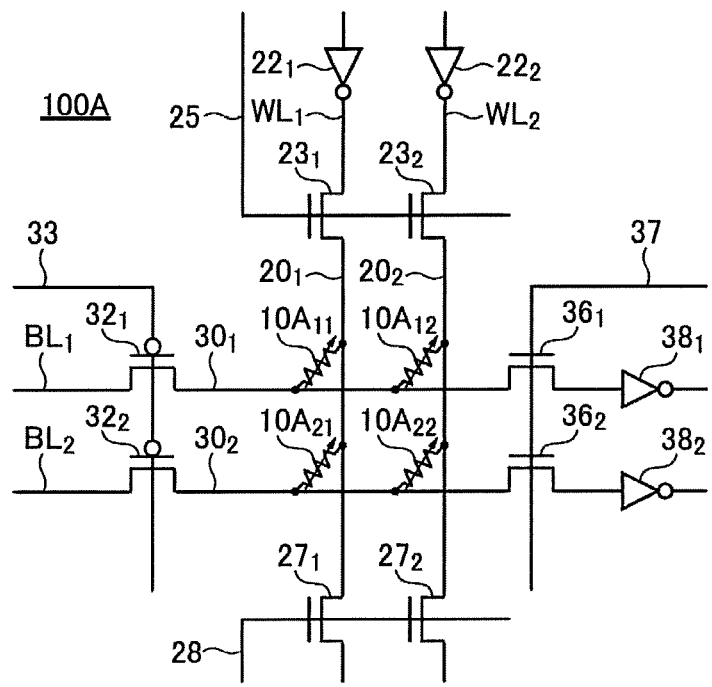
FIG. 14 is a circuit diagram showing a memory array according to a third embodiment.
Figure 15:
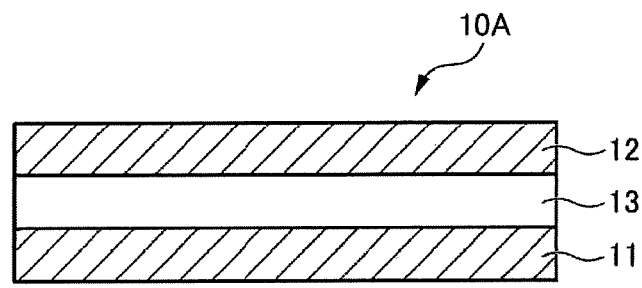
FIG. 15 is a cross sectional view showing a resistive change memory device.

FIG. 14 shows the memory array of the third embodiment. The memory array 100A of the third embodiment has the same configuration as the memory array 100 of the second embodiment shown in FIG. 9, except that the memory devices $10_{11}$ through $10_{22}$ are replaced with memory devices $10A_{11}$ through $10A_{22}$. Each memory device $10A_{ij}$ (i, j=1, 2) is a resistive change memory device shown in FIG. 15, and this resistive change memory device 10A includes an electrode 11, an electrode 12, and a resistive change layer 13 interposed between the electrode 11 and the electrode 12. The electrodes 11 and 12 function as terminals of the resistive change memory device 10A.

Writing in the resistive change memory device 10A is switching the resistance between the electrode 11 and the electrode 12 from a high-resistance state to a low-resistance state by applying a write voltage between the electrode 11 and the electrode 12, and is also called a setting operation. On the other hand, switching the resistance between the electrode 11 and the electrode 12 from a low-resistance state to a high-resistance state by applying a reset voltage between the electrode 11 and the electrode 12 is called a resetting operation. Each memory device $10A_{ij}$ (i, j=1, 2) is the resistive change memory device shown in FIG. 15. One terminal between the electrode 11 and the electrode 12 of the resistive change memory device $10A_{ij}$ (i, j=1, 2) is connected to a wiring line $20_j$, and the other terminal is connected to a wiring line $30_i$.

In the third embodiment, after writing is performed on the memory device to be subjected to writing, which is the memory device $10A_{11}$, information is read from the memory device $10A_{11}$. If the resistance value of the memory device $10A_{11}$ becomes equal to or greater than a predetermined resistance value, additional writing is performed on the memory device $10A_{11}$. An erasing operation is then performed on the transistor $23_1$, which serves as a path through which the additional writing is to be performed. Through this erasing operation, the threshold voltage of the transistor $23_1$ changes toward the negative direction.

This erasing operation is performed on the transistor $23_1$ to apply the same gate current as that at the time of writing. After that, writing is again performed on the memory device $10A_{11}$, and writing is performed on the transistor $23_1$, to return the transistor $23_1$ to the initial state. As the writing is performed on the transistor $23_1$, the threshold voltage of the transistor $23_1$ changes toward the positive direction.

Referring now to FIGS. 16 through 19, a series of procedures from writing to additional writing to be performed on a memory device are described in detail. In FIGS. 16 through 19, the inverters $22_1$, $22_2$, $38_1$, and $38_2$ shown in FIG. 14 are not shown.

Figure 16:
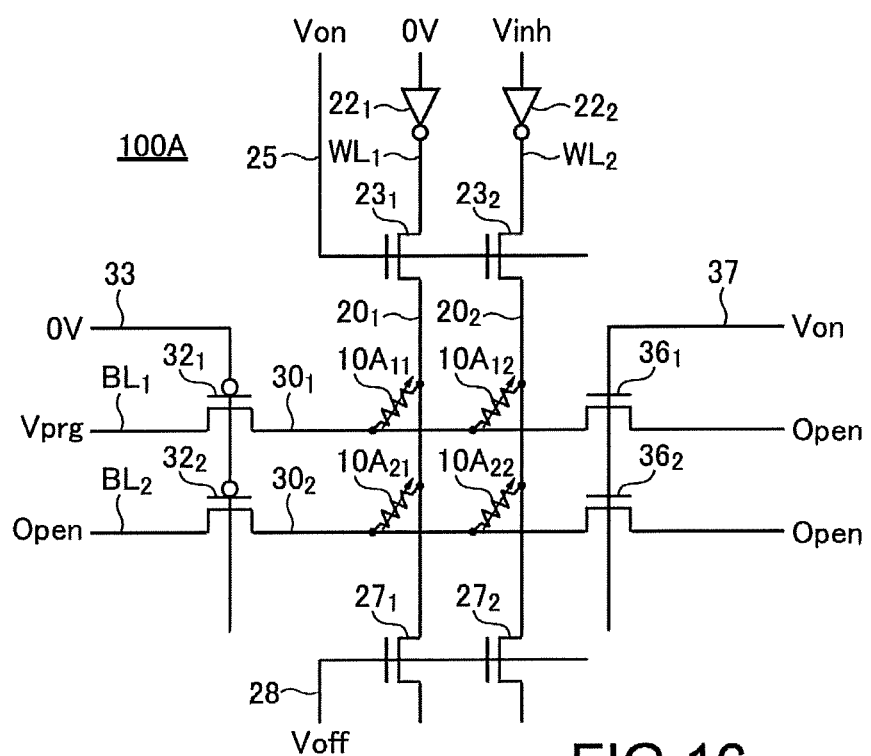
FIG. 16 shows the applied voltages in a case where writing is performed on a transistor in the third embodiment.

FIG. 16 illustrates writing on the memory device $10A_{11}$ in the initial state.

As a write voltage Vprg is applied to the gate of the memory device $10A_{11}$ to be subjected to writing, a voltage, such as 0 V, is applied to the wiring line 33 connected to the gate of the transistor $32_1$ so that the transistor $32_1$ is put into an on-state, and the write voltage Vprg is also applied to the bit line $BL_1$ connected to the source of the transistor $32_1$. As a result of this, the write voltage Vprg is applied to the electrode of the memory device $10A_{11}$ at the side connected to the wiring line $30_1$. Further, a voltage Von is applied to a wiring line 25 to switch on the transistor $23_1$, and 0 V is applied to the word line $Wl_4$, so that 0 V is applied to the electrode of the memory device $10A_{11}$ at the side connected to the wiring line $20_1$.

Meanwhile, a write inhibition voltage Vinh is applied to the word line $WL_2$, and the voltage Vinh is applied to the wiring line $20_2$ via the transistor $23_2$ so that no writing is performed on the memory device $10A_{12}$. As a result of this, the potential of the wiring line $20_2$ is raised. Thus, writing on the memory device $10A_{12}$ can be prevented even if the write voltage Vprg is applied to the electrode of the memory device $10A_{12}$ at the side connected to the wiring line $30_1$. When writing is performed on the memory device $10A_{11}$, a voltage Voff (0 V, for example) is applied to a wiring line 28 to which the gates of the transistor $27_1$ and the transistor $27_2$ are connected, so that the transistor $27_1$ and the transistor $27_2$ connected to the drain of the transistor $23_1$ via the wiring line $20_1$ are both switched off. At the time of the writing, the transistors $36_1$ and $36_2$ are switched on as the voltage Von is applied to a wiring line 37. However, the sources of the transistors $36_1$ and $36_2$ are in an open state, and the bit line $BL_2$ is also in an open state. Also, the voltage Voff is applied to the wiring line 28, so that the transistors $27_1$ and $27_2$ are put into an off-state.

In a case where the verification circuit 120 shown in FIG. 3 determines that the resistance read from the memory device $10A_{11}$ on which the above writing has been performed is higher than a predetermined resistance, additional writing is performed. At the time of this additional writing, not only the write voltage is adjusted, but also the amount of current between the electrode connected to the wiring line $30_1$ and the electrode connected to the wiring line $20_1$ is increased in the memory device $10A_{11}$ on which the additional writing is to be performed. To achieve this, an erasing operation is performed on the transistor $23_1$ having an insulating film formed with a high-k oxide film, so that the threshold voltage of the transistor $23_1$ is changed toward the negative direction. In this manner, the value of the current in the wiring line $20_1$ is made greater than that prior to the erasing operation.

Figure 17:
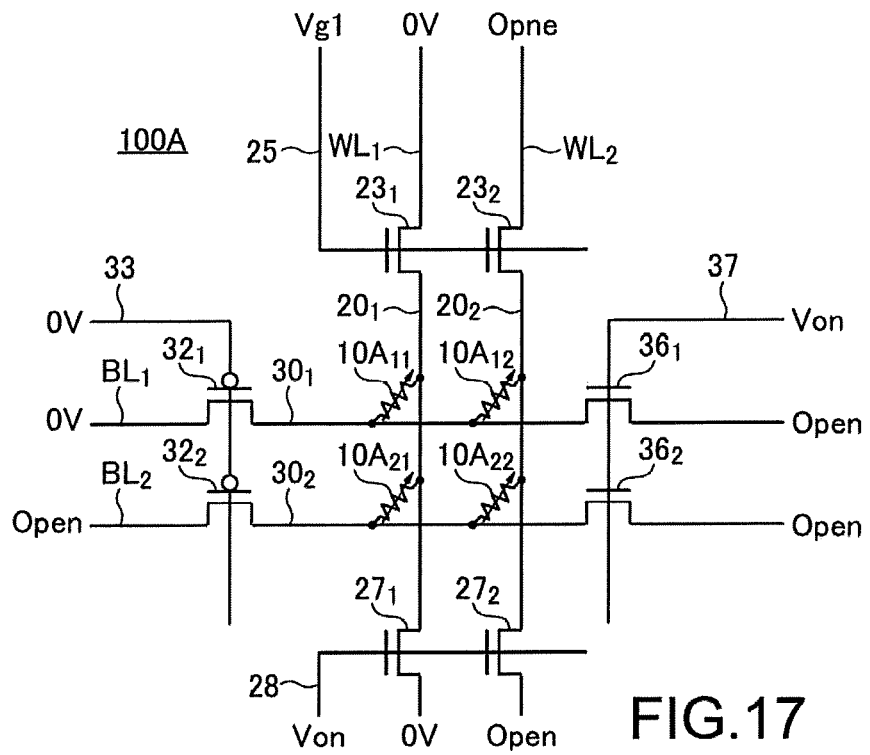
FIG. 17 is a circuit diagram showing the applied voltages in a case where an erasing operation is performed on a transistor in the third embodiment.

Referring now to FIG. 17, a method of performing an erasing operation on the transistor $23_1$ is described. FIG. 17 is a diagram showing the applied voltages in a case where an erasing operation is performed on the transistor $23_1$.

To perform an erasing operation on the transistor $23_1$, 0 V is applied to the wiring line $20_1$ and the wiring line $30_1$ connected to the transistor $23_1$. In the voltage application to the wiring line $30_1$, 0 V is applied to the bit line $BL_1$ connected to the source of the transistor $32_1$, the voltage Von is further applied to the wiring line 28 to switch on the transistor $27_1$, and 0 V is applied to the source of the transistor $27_1$. As a result of this, in the memory device $10A_{11}$ on which writing has been performed, the potentials of the two electrodes are maintained at 0 V, and 0 V can be applied to the word line $WL_1$ connected to the source of the transistor $23_1$ while the written information is kept. In addition to that, a voltage Vg1 (<0 V) is applied to the wiring line 25 connected to the gate of the transistor $23_1$. Alternatively, the transistor $23_1$ may be formed in a different well from that for the transistors $36_1$ and $36_2$, the gate voltage of the transistor $23_1$ may be set at 0 V, and a negative voltage −Vg1 may be applied to the substrate. In this manner, an erasing operation on the transistor $23_1$ can be performed. Even if a potential difference is generated between the two electrodes of the memory device $10A_{11}$, and the memory information is reset, writing can be performed at the time of additional writing, with the amount of current being larger than that at the first writing. Thus, the written information is not modified, and wrong writing is not performed. Even if the memory device $10A_{11}$ is reset, 0 V is applied to the wiring line $20_1$ connected to the drain of the transistor $23_1$ via the transistor $27_1$, so that an erasing operation can be performed on the transistor $23_1$. During the erasing operation, the voltage Von is applied to the wiring line 37, so that the transistors $36_1$ and $36_2$ are switched on. The sources of the transistors $36_1$ and $36_2$, the source of the transistor $27_2$, the word line $WL_2$, and the bit line $BL_2$ are put into in an open state.

Figure 18:
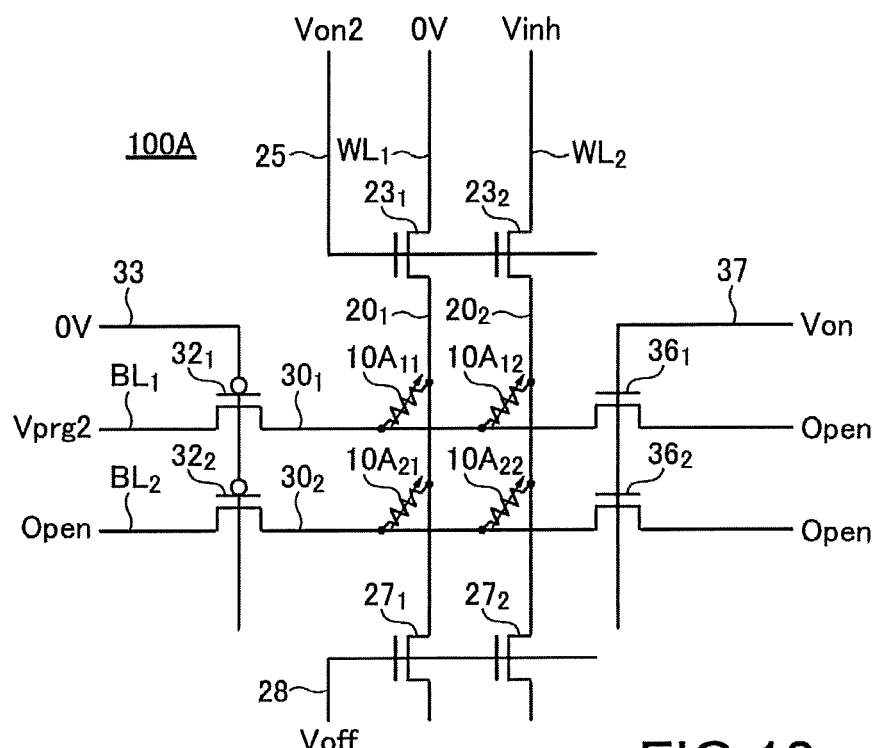
FIG. 18 is a circuit diagram showing the applied voltages in a case where additional writing is performed on a memory device in the third embodiment.

Referring now to FIG. 18, a method of performing additional writing on the memory device $10A_{11}$ is described. FIG. 18 is a diagram showing the applied voltages in a case where additional writing is performed on the memory device $10A_{11}$. The additional writing is performed in the same manner as the writing in the initial state, except for a write voltage Vprg2 to be applied to the bit line $BL_1$ and a voltage Von2 to be applied to the wiring line 25. The write voltage Vprg2 (≥Vprg) that is used in this additional writing and is applied to the bit line $BL_1$, and the voltage Von2 (≥Von) that is used in this additional writing and is applied to the wiring line 25 connected to the gate of the transistor $23_1$ may be changed depending on the resistance of the memory device $10A_{11}$ on which the additional writing is to be performed. At the time of this additional writing, the bit line $BL_2$ and the sources of the transistor $36_1$ and $36_2$ are in an open state, as shown in FIG. 18.

Figure 19:
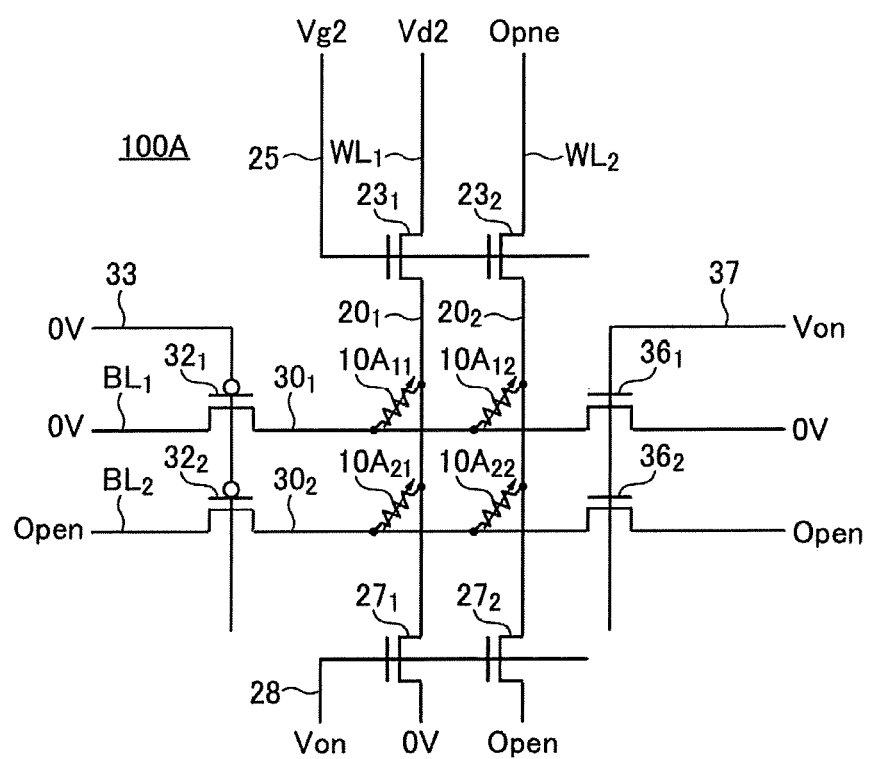
FIG. 19 is a circuit diagram showing the applied voltages in a case where a transistor is initialized in the third embodiment.

Lastly, the transistor $23_1$ is initialized, and the applied voltages at this stage are shown in FIG. 19. The reason that the initialization is performed at this stage is to prevent a difference in the threshold voltages of the transistors $23_1$ and $23_2$ between the column to which the memory device subjected to the additional writing belongs and the column to which the memory device subjected to the additional writing does not belong, and thus, prevent wrong reading of read data. In the initialization of the transistor $23_1$, an erasing operation has been performed on the transistor $23_1$, and writing should be performed on the transistor $23_1$ subjected to the erasing operation.

To perform writing on the transistor $23_1$, a voltage Vd2 is applied to the word line $WL_1$ connected to the source of the transistor $23_1$, and a voltage Vg2 is applied to the wiring line 25 connected to the gate. In the voltage application to the wiring line $20_1$ connected to the drain, 0 V is applied to the wiring line 33 to switch on the transistor $32_1$, and 0 V is also applied to the bit line $BL_1$ connected to the source. Further, the voltage Von is applied to the wiring line 28 to switch on the transistor $27_1$, and 0 V is applied to the source of the transistor $27_1$, so that the potentials of the two electrodes of the memory device $10A_{11}$ on which writing is to be performed are maintained at 0 V, and 0 V can be applied to the wiring line $20_1$ connected to the source of the transistor $23_1$ while the written information is kept. Here, the voltage Vd2 is a positive voltage that is lower than the write voltage Vprg for the memory device, or Vd2<Vprg. With the voltage Vd2, no writing is performed on the memory device $10A_{11}$. At the time of the initialization of the transistor $23_1$, the voltage Von is applied to the wiring line 37, to switch on the transistors $36_1$ and $36_2$. A voltage of 0 V is applied to the source of the transistor $36_1$, while the source of the transistor $36_2$ is put into an open state. The word line $WL_2$, the bit line $BL_2$, and the source of the transistor $27_2$ are put into in an open state.

As described above, according to the third embodiment, transistors each having a high-k metal gate are used as the transistors $23_1$ and $23_2$. Thus, it is possible to provide an integrated circuit including a memory that can avoid having a complicated circuit configuration even if additional writing is to be performed. It is also possible to provide a write method.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An integrated circuit comprising:
   first and second wiring lines;
   a memory device including a first terminal connected to the first wiring line and a second terminal connected to the second wiring line, a resistance of the memory device being switchable between a high-resistance state and a low-resistance state;
   a first transistor including a high-k metal gate, one of a source and a drain of the first transistor being connected to the first wiring line and the memory device;
   a first circuit electrically coupled to the memory device to apply a first write voltage between the first terminal and the second terminal, and switch the resistance of the memory device from a high-resistance state to a low-resistance state;
   a second circuit electrically coupled to the memory device to read the resistance of the memory device, and compare a read value of the resistance with a predetermined value;
   a third circuit electrically coupled to the memory device to lower a threshold voltage of the first transistor when the read value of the resistance is greater than the predetermined value;
   a fourth circuit electrically coupled to the memory device to apply a second write voltage between the first terminal and the second terminal after the threshold voltage is lowered, the second write voltage being not lower than the first write voltage; and
   a fifth circuit electrically coupled to the memory device to raise the threshold voltage of the first transistor.

2. The integrated circuit according to claim 1, further comprising
   a second transistor including a source and a drain, one of the source and the drain being connected to the second wiring line.

3. The integrated circuit according to claim 1, further comprising
   a third transistor including a source and a drain, one of the source and the drain being connected to the first wiring line.

4. The integrated circuit according to claim 1, wherein the memory device is a transistor including a source, a drain, and a gate, the source and the drain being connected to the first wiring line, the gate being connected to the second wiring line.

5. The integrated circuit according to claim 3, wherein the memory device is a resistive change memory device including a first electrode connected to the first wiring line, a second electrode connected to the second wiring line, and a resistive change layer interposed between the first electrode and the second electrode.

6. The integrated circuit according to claim 1, wherein the third circuit lowers the threshold voltage of the first transistor by applying 0 V to the source and the drain of the first transistor, and applying a negative voltage to the high-k metal gate or applying a positive voltage to a substrate in which the first transistor is formed.

7. The integrated circuit according to claim 1, wherein the fifth circuit raises the threshold voltage of the first transistor by applying 0 V to the source and the drain of the first transistor, and applying a lower voltage than the first write voltage to the high-k metal gate.

8. A write method implemented in an integrated circuit including: first and second wiring lines; a memory device including a first terminal connected to the first wiring line and a second terminal connected to the second wiring line, a resistance of the memory device being switchable between a high-resistance state and a low-resistance state; and a first transistor including a high-k metal gate, one of a source and a drain of the first transistor being connected to the first wiring line,
   the write method comprising:

applying a first write voltage between the first terminal and the second terminal, and switching the resistance of the memory device from a high-resistance state to a low-resistance state;

reading the resistance of the memory device, and comparing a read value of the resistance with a predetermined value;

lowering a threshold voltage of the first transistor when the read value of the resistance is greater than the predetermined value;

applying a second write voltage between the first terminal and the second terminal after the threshold voltage is lowered, the second write voltage being not lower than the first write voltage; and raising the threshold voltage of the first transistor.

9. The write method according to claim 8, wherein the memory device is a transistor including a source, a drain, and a gate, the source and the drain being connected to the first wiring line, the gate being connected to the second wiring line.

10. The write method according to claim 8, wherein the memory device is a resistive change memory device including a first electrode connected to the first wiring line, a second electrode connected to the second wiring line, and a resistive change layer interposed between the first electrode and the second electrode.

* * * * *